(12) United States Patent
Han

(10) Patent No.: US 7,507,635 B2
(45) Date of Patent: Mar. 24, 2009

(54) CMOS IMAGE SENSOR AND METHOD OF FABRICATING THE SAME

(75) Inventor: Chang Hun Han, Icheon (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 233 days.

(21) Appl. No.: 11/318,434

(22) Filed: Dec. 28, 2005

(65) Prior Publication Data

US 2006/0138482 A1    Jun. 29, 2006

(30) Foreign Application Priority Data

Dec. 28, 2004    (KR) .................. 10-2004-0113801

(51) Int. Cl.
*H01L 21/76* (2006.01)
(52) U.S. Cl. .................. 438/435; 438/221
(58) Field of Classification Search .......... 438/210, 438/218, 221, 222, 435
See application file for complete search history.

(56) References Cited

U.S. PATENT DOCUMENTS

| | | | | |
|---|---|---|---|---|
| 5,942,803 | A * | 8/1999 | Shim et al. ............. | 257/774 |
| 6,214,747 | B1 * | 4/2001 | Chou et al. ............. | 438/780 |
| 7,241,671 | B2 * | 7/2007 | Han ....................... | 438/524 |
| 2003/0127666 | A1 | 7/2003 | Lee | |
| 2004/0178430 | A1 | 9/2004 | Rhodes et al. | |
| 2004/0251481 | A1 | 12/2004 | Rhodes | |
| 2006/0057806 | A1 * | 3/2006 | Dong ..................... | 438/257 |

FOREIGN PATENT DOCUMENTS

| | | | |
|---|---|---|---|
| KR | 10-2001-0003139 | | 1/2001 |
| KR | 2001038622 A | * | 5/2001 |
| KR | 10-2003-0056323 | | 7/2003 |
| KR | 2004056961 A | * | 7/2004 |
| KR | 2004059998 A | * | 7/2004 |

* cited by examiner

*Primary Examiner*—N Drew Richards
*Assistant Examiner*—Seth Barnes
(74) *Attorney, Agent, or Firm*—McKenna Long & Aldridge LLP

(57) ABSTRACT

A CMOS image sensor and method for fabricating the same, wherein the CMOS image sensor has minimized dark current at the boundary area between a photodiode and an isolation layer. The present invention includes a first-conductivity-type doping area formed in the device isolation area of the substrate, the first-conductivity-type doping area surrounding the isolation area and a dielectric layer formed between the isolation layer and the first-conductivity-type doping area, wherein the first-conductivity-type doping area and the dielectric layer are located between the isolation layer and a second-conductivity-type diffusion area.

6 Claims, 5 Drawing Sheets

CMOS IMAGE SENSOR AND METHOD OF FABRICATING THE SAME

This application claims the benefit of the Korean Patent Application No. P2004-113801 filed on Dec. 28, 2004, which is hereby incorporated by reference as if fully set forth herein.

BACKGROUND OF THE INVENTION

1. Field of the Invention

The present invention relates to a CMOS image sensor, and more particularly, to an improved CMOS image sensor that prevents dark current from occurring and a method of fabricating the same.

2. Discussion of the Related Art

Generally, an image sensor is a semiconductor device that transforms an optical image into an electric signal. Image sensors are mainly classified into charge coupled device image sensor (hereinafter abbreviated as "CCD") and complementary metal oxide semiconductor image sensor (hereinafter abbreviated as "CMOS").

CCDs consist of a plurality of photodiodes (PD) arranged in a matrix, a plurality of vertical charge coupled devices (VCCD) provided in vertical direction between the plurality of the photodiodes, a horizontal charge coupled device (HCCD), and a sense amplifier. The photodiodes convert optical signals into electric signals by outputting charges that are transferred in the vertical direction by the VCCDs. The charges transferred by each VCCD are then transferred in a horizontal direction by the HCCD. Finally, these charges in the horizontal direction are sensed by the sense amplifier that in turn outputs the electric signal.

The above-configured CCDs have a complicated driving mechanism, they require considerable power consumption, and they need a complicated fabricating process with a lot of photo-processes. Additionally, it is disadvantageous to use the above configured CCDs when trying to reduce the size of a product because it is difficult to integrate a control circuit, a signal processing circuit, an analog/digital converting circuit (A/D converter) and the like on a CCD chip.

Recently, focus has turned to CMOS image sensors as the next generation image sensors because they overcome the disadvantages of CCDs. The CMOS image sensor employs a switching method for sequentially detecting an output of each unit pixel by means of MOS transistors. The MOS transistors are formed on a semiconductor substrate. Each MOS transistor corresponds to a unit pixel. Additionally, a control circuit, signal processing circuit and the like are used as peripheral circuits. The CMOS image sensor having a photodiode and a MOS transistor within a unit pixel implements an image by sequentially detecting an electric signal of each unit pixel according to a switching method.

The CMOS image sensor, is advantageous because of its low power consumption, and because it requires a simple fabrication process with a small number of photo-processing steps. Additionally, it is possible to integrate a control circuit, a signal processing circuit, an analog/digital converting circuit and the like on a CMOS sensor chip, thereby facilitating the miniaturization of a product. Accordingly, the CMOS image sensor may be widely used for various applications such as digital still cameras, digital video cameras and the like.

CMOS image sensors are classified into 3-T type, 4-T type, 5-T type and the like according to the number of transistors. The 3-T type CMOS image sensor consists of one photodiode and three transistors. And, the 4-T type CMOS image sensor consists of one photodiode and four transistors.

FIG. 1 is a layout of a unit pixel of a general 3-T CMOS sensor.

Referring to FIG. 1, in a unit pixel of a general 3T type CMOS image sensor, an active area 10 is defined. A photodiode 20 is formed on a wider part of the active area 10. Gate electrodes 120, 130 and 140 of the three transistors are formed to overlap the rest of the active area 10. The three transistors, namely, the reset, drive and selection transistors Rx, Dx and Sx are configured with the gate electrodes 120, 130 and 140, respectively. Impurity ions are implanted into the active area 10 but not below the gate electrodes 120, 130 and 140. The impurity ions form source/drain regions for each of the three transistors. Thereafter, a power voltage Vdd is applied to the source/drain regions between the reset and drive transistors, Rx and Dx, while the source/drain regions of the select transistor Sx are connected to a read circuit (not shown in the drawing).

Each of the gate electrodes 120, 130 and 140 is connected to a corresponding signal line (not shown in the drawing). Each of the corresponding signal line is provided with a pad on one end thereof so that it may be connected to an external drive circuit.

FIG. 2 is a cross-sectional diagram according to the line II-II' of FIG. 1 of a 3T type CMOS image sensor according to the prior art, showing a photodiode and a reset transistor.

As shown in FIG. 2, a P$^-$-type EPI layer 101 is formed on a P$^{++}$-type semiconductor substrate 100. The semiconductor substrate 100 is defined by an active area (10 in FIG. 1) and a device isolation area. An isolation layer 103 is formed in the device-isolation area.

A gate oxide 121 is formed on the EPI layer 101. A gate 123 is then formed on the gate oxide 121, thereby forming a reset transistor. Dielectric spacers 125 are formed on both sidewalls of gate 123.

N$^-$-type diffusion area 131 and P$^o$-type diffusion area 132 are formed sequentially in the EPI layer corresponding to a photodiode (PD). In this example, the P$^o$-type diffusion area 132 is formed on the N$^-$-type diffusion area 131. Additionally, a high-density n-type diffusion area (n$^+$) and a low-density n-type diffusion area (n$^-$) are formed as source/drain (S/D) area for the reset transistor.

The conventional CMOS image sensor of the structure described above, has the disadvantage of resulting in increased dark current, which causes deterioration of the charge-storing capability and thus of the general performance of a device.

The dark current is created by electrons transferring from the photodiode to other areas of the device when no light enters the photodiode. It has been reported that the dark current is due to the dangling bond or defects distributed around the surface-adjacent area of the device, the boundary area between the isolation layer 103 and the P$^o$-type diffusion area 132, the boundary area between the isolation layer 103 and the N$^-$-type diffusion area 131, the boundary area between the P$^o$-type diffusion area 132 and the N$^-$-type diffusion area 131, P$^o$-type diffusion area 132 and N$^-$-type diffusion area 131. The dark current may cause serious problems such as deterioration of charge-storing capability and general deterioration in performance of the CMOS image sensor in low illumination circumstances.

To reduce the dark current effect occurring at the surface-adjacent area of the device, according to the conventional CMOS image sensor, the P$^o$-type diffusion area 132 is formed on the N$^-$-type diffusion area 131 for the photodiode. Such CMOS image sensor, however, is seriously affected by the dark current occurring at the boundary area between the isolation layer 103 and the P°-type diffusion area 132 and the boundary area between the isolation layer 103 and the N⁻-type diffusion area 131.

Furthermore, as shown in FIG. 2, when a photoresist pattern is formed on the EPI layer 101 as an ion injection mask to form the N⁻-type diffusion area 131 and P°-type diffusion area 132 for the photodiode, the whole active area corresponding to the photodiode is exposed through the opening made in the photoresist pattern. When impurities are injected to the exposed active area using ion injection process to form the N⁻-type diffusion area 131 and P°-type diffusion area 132, they are also injected into the boundary area between the active area 131 and 132 of the photodiode and the isolation layer 103. These ions induce damages and defects at the boundary area between the active area 131 and 132 of the photodiode and the isolation layer 103. These defects produce electrons and hole carriers, and make the electrons recombine. Consequently, leakage current of the photodiode increases and so does the dark current of the CMOS image sensor.

Consequently, because it is hard to inhibit the dark current occurring at the boundary area between the isolation layer 103 and the active area 131 and 132 of the photodiode there is a limit to the improvement of dark current characteristics in a conventional CMOS image sensor.

SUMMARY OF THE INVENTION

The present invention is directed to a CMOS image sensor and a method of fabricating the same that substantially obviates one or more problems due to limitations and disadvantages of the related art.

An advantage of the present invention is to provide a CMOS image sensor and a method of fabricating the same that prevents ions of the active area from diffusing into the isolation layer and thus does not generate dark current by forming a P⁺-type area and an oxide layer between an isolation layer and an active area with the photodiode.

Additional advantages, objects, and features of the invention will be set forth in part in the description which follows and in part will become apparent from the description, or may be learned by practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a CMOS image sensor according to the present invention comprises a first-conductivity-type semiconductor substrate defined by an active area and a device isolation area, an isolation layer formed in the device isolation area of the substrate, a second-conductivity-type diffusion area formed in the active area of the substrate, a first-conductivity-type doping area formed in the device isolation area of the substrate, the first-conductivity-type doping area surrounding the isolation area and a dielectric layer formed between the isolation layer and the first-conductivity-type doping area, wherein the first-conductivity-type doping area and the dielectric layer are located between the isolation layer and the second-conductivity-type diffusion area.

In another aspect of the present invention, a method of fabricating a CMOS image sensor according to the present invention comprises the steps of forming a pad oxide layer and a nitride layer sequentially over a first-conductivity-type semiconductor substrate defined by an active area and a device isolation area, selectively etching the nitride layer to form an opening through which a part of the pad oxide layer is exposed, forming a first-conductivity-type doping area using the selectively etched nitride layer as a mask, forming spacers on sidewalls of the opening, selectively etching the exposed part of the pad oxide layer and the substrate corresponding thereto using the etched nitride layer and the spacers as a mask to form a trench, forming a dielectric layer in the trench, forming an isolation layer on the dielectric layer to fill the trench, removing the spacers, the nitride layer and the pad oxide layer and forming a second-conductivity-type diffusion area in the active area of the substrate in such a way that between the second-conductivity-type diffusion area and the isolation layer is a space corresponding to the first-conductivity-type doping area and the dielectric layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to an embodiment of the present invention, examples of which are illustrated in the accompanying drawings.

Figure 1:
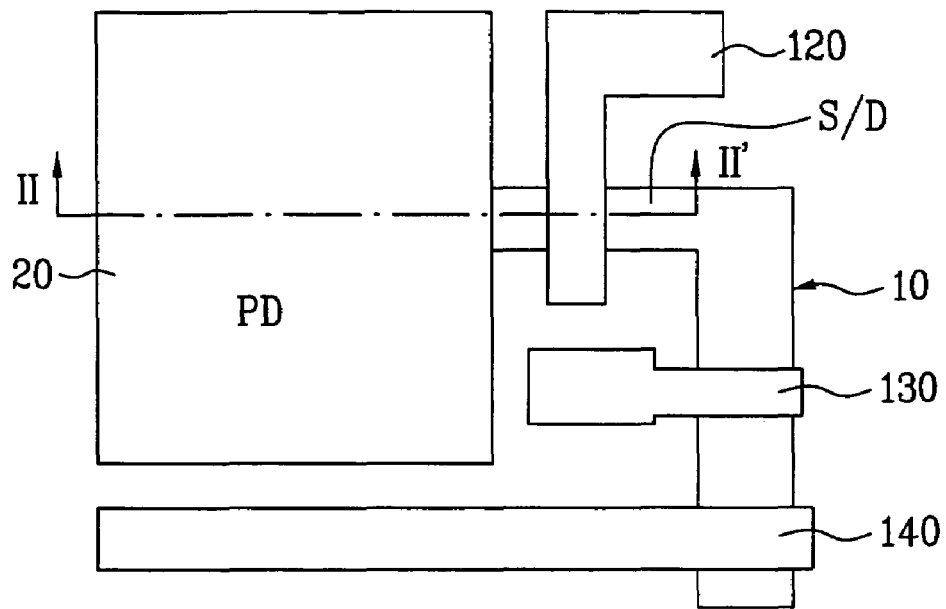
FIG. 1 is a general layout of a unit pixel of a CMOS image sensor.
Figure 2:
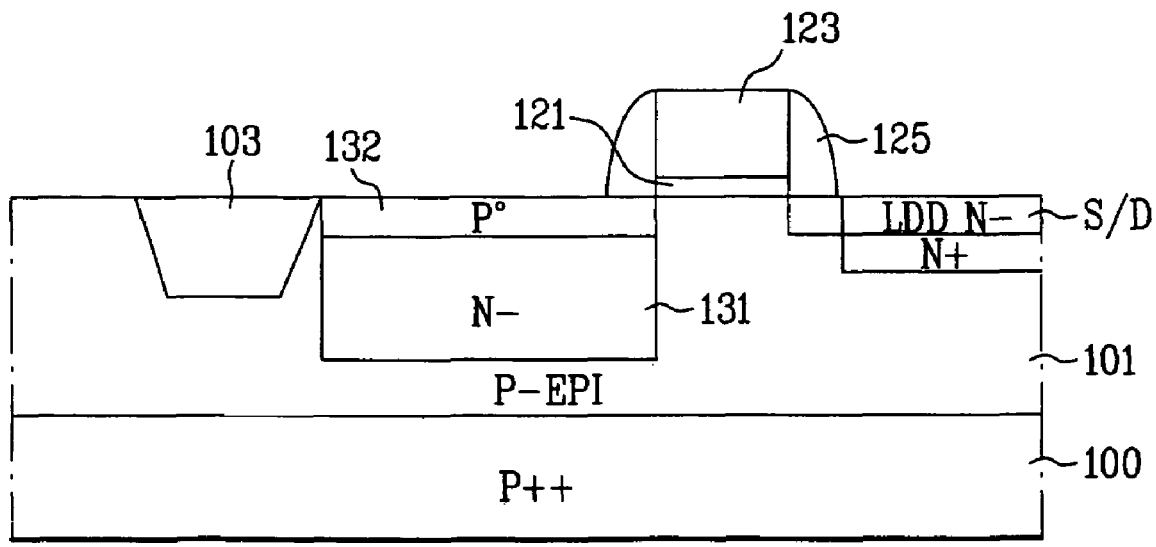
FIG. 2 is a cross-sectional diagram of a 3T type CMOS image sensor according to the related art showing a photodiode and a reset transistor according to the line II-II' of FIG. 1.
Figure 3:
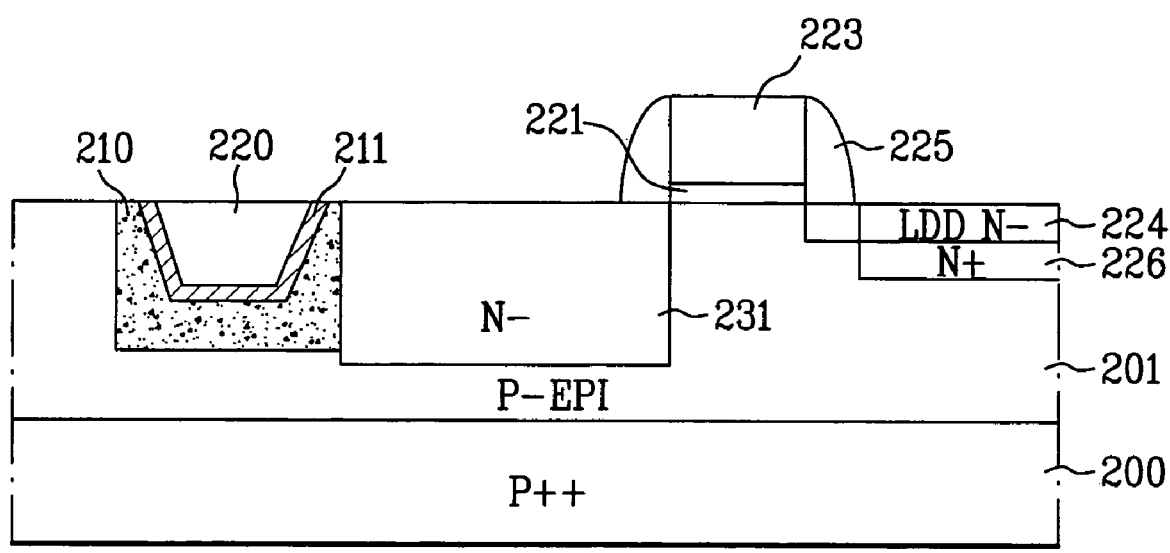
FIG. 3 is a cross-sectional diagram of a 3T type CMOS image sensor of the present invention showing a photodiode and a reset transistor according to the line II-II' of the FIG. 1.

FIG. 3 is a cross-sectional diagram of a 3T type CMOS image sensor according to an embodiment of the present invention showing a photodiode and a reset transistor according to the line II-II' of FIG. 1.

Referring to FIG. 3, a P⁻-type EPI layer 201 is formed on a P⁺⁺-type semiconductor substrate 200 defined by an active area (10 of FIG. 1) and a device isolation area. An isolation layer 220 is formed in the device isolation area. The active area of the semiconductor substrate 200 is defined by a photodiode area and a transistor area.

A gate oxide layer 221 and a gate 223 are formed sequentially on the EPI layer 201 to form a reset transistor of FIG. 1. Dielectric spacers 225 are formed on sidewalls of gate 223. N⁻-type diffusion area 231 is formed in area of the EPI layer 201 corresponding to the photodiode area. A source/drain (S/D of FIG. 1) region is formed in the surface of the EPI layer 201 beside the gate 223, wherein the source/drain area includes a high-density n-type diffusion area (n⁺) 226 and a low-density n-type diffusion area (n⁻) 224.

According to the present invention, a P⁺-type doping area 210 and a thermal oxide layer 211 are formed between the isolation layer 220 and the N⁻-type diffusion area 231. P⁺-type doping area 210 and thermal oxide 211 prevent dark current problem present in conventional CMOS image sensor having an isolation layer directly connected to a N⁻-type diffusion area. When N⁻-type ions are injected into the semiconductor substrate to form the photodiode, the P⁺-type doping area 210 and the thermal oxide layer 211 both located between the isolation layer 220 and the N⁻-type diffusion area 231 prevent the N⁻-type ions from permeating into the isolation layer 220.

The P⁺-type doping area 210 is formed by doping EPI layer 201 with boron (B). The thermal oxide layer 211 is formed using a thermal oxidation process. The thermal oxide layer 211 may be 50-500 Å thick. During the thermal oxidation process, lateral diffusion of the boron (B) of the P⁺-type doping area 210 increases by means of interstitial injection. The boron (B) is prevented from permeating into the N⁻-type diffusion area 231 of the photodiode in a subsequent well annealing process.

FIG. 4a to 4f are cross-sectional diagrams illustrating the processes according to the method of fabricating a CMOS image sensor of the present invention.

Hereinafter, the method of the present invention is described in detail focusing on the processes to form an isolation layer and a photodiode area on a semiconductor substrate.

Figure 4A:
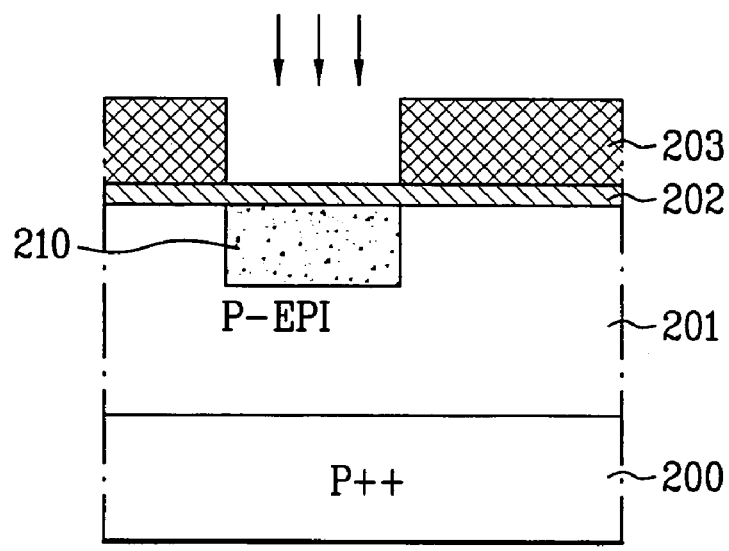
FIG. 4a to 4f are cross-sectional diagrams illustrating the process according to the method of fabricating a CMOS image sensor of the present invention.

Referring to FIG. 4a, a low density first-conductivity-type (P⁻-type) EPI layer 201 is formed on a semiconductor substrate 200 such as a high density first-conductivity-type (P⁺⁺-type) monocrystalline silicon and the like by using an epitaxial process. The EPI layer 201 is formed to improve light-sensitivity and capability to save light charges of the low-voltage photodiode by enabling depletion region of the photodiode to be formed widely and deeply.

A pad oxide layer 202 is formed on the EPI layer 201. A nitride layer 203 is then formed on the pad oxide layer 202.

The nitride layer 203 is selectively removed by etching to form an opening through which a part of the pad oxide layer 202 is exposed.

A P⁺-type doping area 210 is formed right below the surface of the EPI layer 201 by doping high density P-type ion impurities using the selectively removed nitride layer 203 as a mask. B or BF₂ may be used for the high density P-type ion.

Figure 4B:
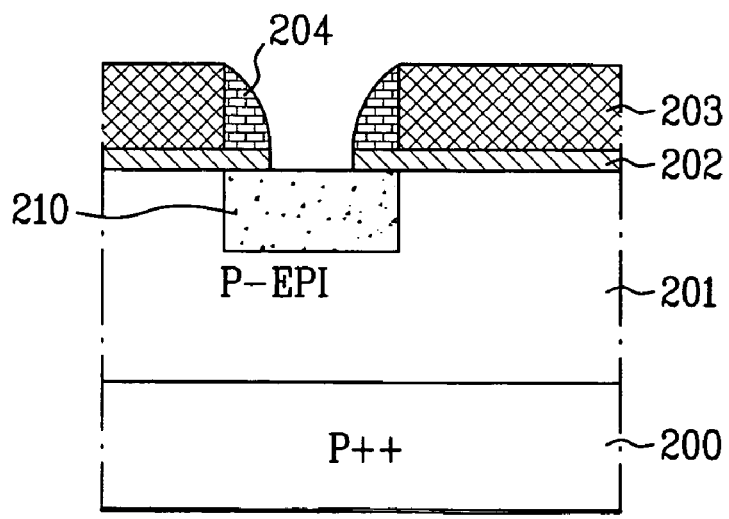

Referring to FIG. 4b, a dielectric layer (not shown) is formed on entire surface of the EPI layer 201 including over the selectively patterned nitride layer 203. This latter formed dielectric layer is then etched-back to form spacers on sidewalls of the opening in the nitride layer 203.

The exposed part of the pad oxide layer 202 is then selectively etched using the nitride layer 203 and spacers 204 as a mask.

Figure 4C:
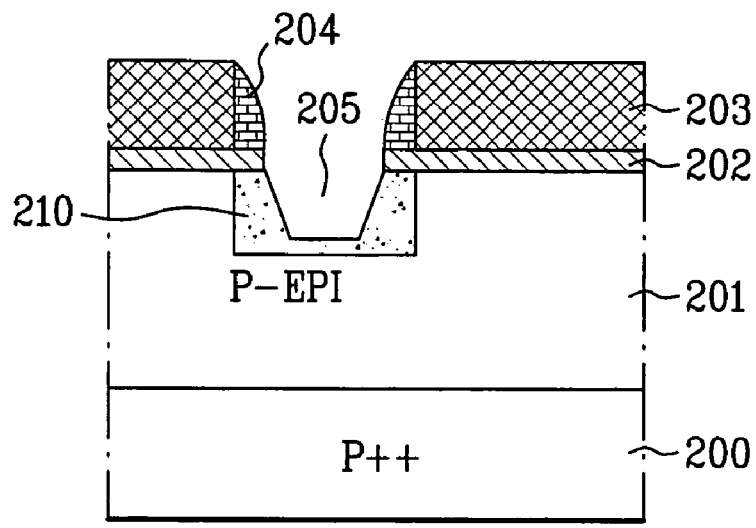

Referring to FIG. 4c, the EPI layer 201 in which the P⁺-type doping area 210 is formed is removed selectively using the nitride layer 203 and the spacers 204 as a mask to form a trench 205 of a predetermined depth. The trench 205 is formed within the P⁺-type doping area 210 such that the whole trench 205 is surrounded by the P⁺-type doping area 210.

Figure 4D:
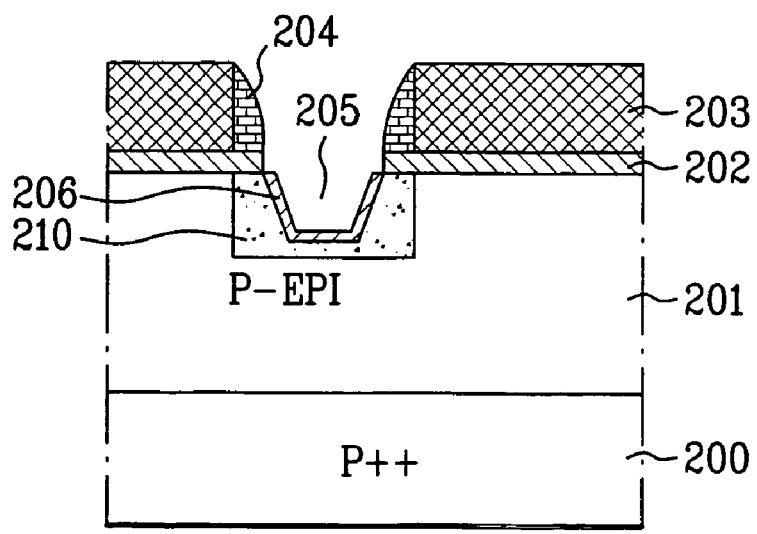

Referring to FIG. 4d, a 50-500 Å thick thermal oxide layer 206 is formed in the trench 205 by means of thermal oxidation process. The thermal oxidation process may be carried out at about 800-1150° C. The thermal oxide layer 206 is formed to be directly in contact with the P⁺-type doping area 210. During the thermal oxidation process, lateral diffusion of the B or BF₂ ions in the P⁺-type doping area 210 increases by means of interstitial injection. Subsequently, a well annealing process is used to prevent the B or BF₂ from permeating into a N⁻-type diffusion area 231 (shown in FIG. 4f) that is to form a photodiode.

Figure 4E:
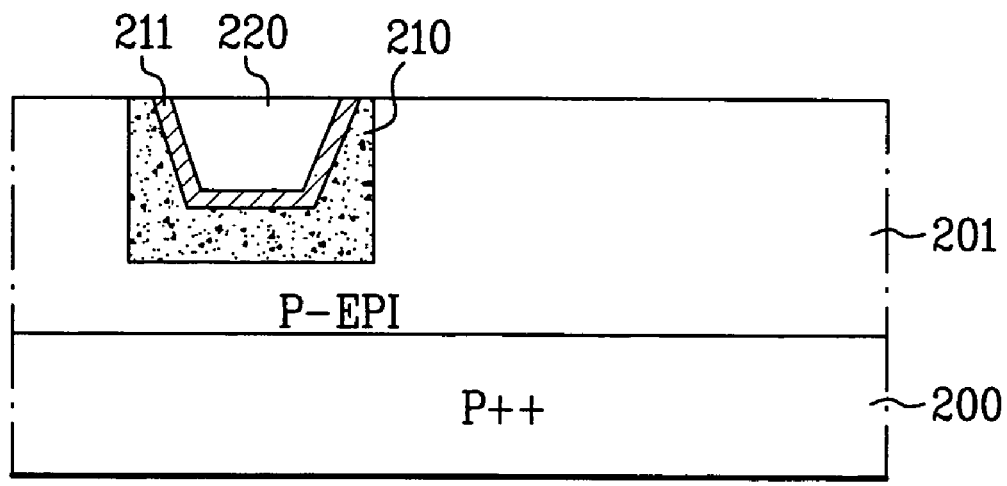

Referring to FIG. 4e, an isolation layer 220 is formed on the thermal oxide layer 206 to fill the trench 205. The isolation layer 220, is formed by depositing a dielectric layer of SOG (Spin On Glass), USG (Undoped Silicate Glass) or TEOS type on entire surface of the EPI layer 201 including the trench 205. Thereafter, the dielectric layer is removed, except the part inside the trench 205, by a CMP (Chemical Mechanical Polishing) or an etch-back process. The spacers 204, the nitride layer 203 and the pad oxide layer 202 are also removed by a cleaning and planarization process.

Figure 4F:
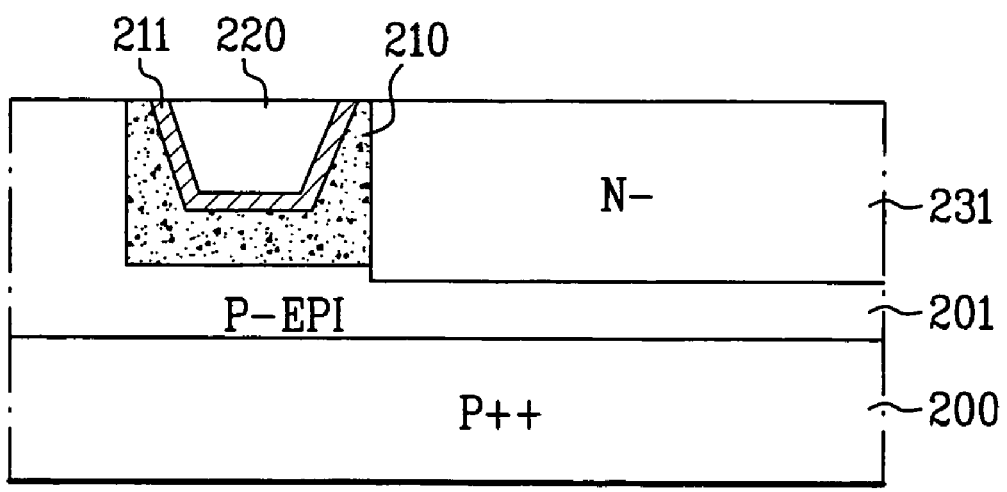

Referring to FIG. 4f, the photodiode area is exposed after coating and patterning a photoresist (not shown) on the entire EPI layer 201. A N⁻-type diffusion area 231 is then formed in the photodiode area by injection of N⁻-type ion impurities into the photodiode area using the patterned photoresist (not shown) as a mask. Although not shown in the drawings, a gate oxide and a gate are formed on the active area of the EPI layer 201 using conventional processes before the N⁻-type diffusion area 231 is formed.

The CMOS image sensor of the present invention substantially reduces dark current, that otherwise may occur at the boundary area between the photodiode and the isolation layer 220, by forming the N⁻-type diffusion area 231 far from the isolation layer 220 locating the P⁺-type doping area 210 and thermal oxide layer 211 therebetween.

A P°-type diffusion area (not shown) may be also formed on the N⁻-type diffusion area 231.

Accordingly, the present invention provides the following effects and advantages.

First of all, the present invention minimizes the dark current at the boundary area between a photodiode and an isolation layer by forming the P⁺-type doping area 210 and thermal oxide layer 211 therebetween.

By reducing the dark current, consequently, the present invention can preclude the defects that otherwise may occur due to the dark current and improve the reliability of the CMOS image sensor.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a CMOS image sensor, comprising the steps of:

forming a pad oxide layer and a nitride layer sequentially over a first-conductivity-type semiconductor substrate defined by an active area and a device isolation area;

selectively etching the nitride layer to form an opening through which a part of the pad oxide layer is exposed;

forming a first-conductivity-type doping area using the selectively etched nitride layer as a mask;

forming spacers on sidewalls of the opening;

selectively etching the exposed part of the pad oxide layer and underlying substrate using the etched nitride layer and the spacers as a mask to form a trench;

forming a dielectric layer in the trench;

forming an isolation layer on the dielectric layer to fill the trench;

removing the spacers, the nitride layer and the pad oxide layer; and forming a second-conductivity-type diffusion area in the active area of the substrate in such a way that between the second-conductivity-type diffusion area and the isolation layer is a space corresponding to the first-conductivity-type doping area and the dielectric layer.

2. The method of claim 1, wherein the step of forming the dielectric layer in the trench comprises a process of thermally oxidizing the substrate including the trench at 800 ~1150°C.

3. The method of claim 1, wherein the dielectric layer is formed to have a thickness of 50~500 Å.

4. The method of claim 1, wherein the first-conductivity-type doping area is formed by injecting B or $BF_2$ into the device isolation area of the substrate.

5. The method of claim 1, the spacers are formed by forming a nitride layer on entire surface of the substrate and carrying out etch-back thereof.

6. The method of claim 1, wherein the first-conductivity-type substrate comprises:
a high density first-conductivity-type silicon; and
a low density first-conductivity-type epitaxial layer formed on the high density first-conductivity-type silicon.

* * * * *